(12) United States Patent
Mbouombouo et al.

(10) Patent No.: US 6,532,576 B1
(45) Date of Patent: Mar. 11, 2003

(54) CELL INTERCONNECT DELAY LIBRARY FOR INTEGRATED CIRCUIT DESIGN

(75) Inventors: Benjamin Mbouombouo, San Jose, CA (US); Stefan Graef, San Jose, CA (US); Juergen Lahner, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 99 days.

(21) Appl. No.: 09/801,392

(22) Filed: Mar. 7, 2001

(51) Int. Cl.[7] .............................................. G06F 17/50
(52) U.S. Cl. ........................................................ 716/6
(58) Field of Search ............................... 700/121; 716/2, 716/6, 17

(56) References Cited

U.S. PATENT DOCUMENTS

| | | | |
|---|---|---|---|
| 5,610,833 A | | 3/1997 | Chang et al. ............... 364/491 |
| 5,691,662 A | * | 11/1997 | Soboleski et al. .......... 327/292 |
| 5,933,356 A | * | 8/1999 | Rostoker et al. ............... 716/6 |
| 5,946,211 A | * | 8/1999 | Glover ....................... 700/121 |

* cited by examiner

Primary Examiner—Matthew Smith
Assistant Examiner—Thuan Do
(74) Attorney, Agent, or Firm—Fitch, Even, Tabin & Flannery

(57) ABSTRACT

A method for characterizing cell interconnect delay is disclosed that may be included in a library for use with logic design tools. A method of characterizing cell interconnect delay includes the steps of (a) receiving as inputs a plurality of input ramptimes and a plurality of interconnect lengths for a selected cell, and (b) calculating an output ramptime and a total cell delay including a cell delay and an interconnect delay for each of the plurality of input ramptimes for each of the plurality of interconnect lengths for the selected cell from the inputs.

16 Claims, 3 Drawing Sheets

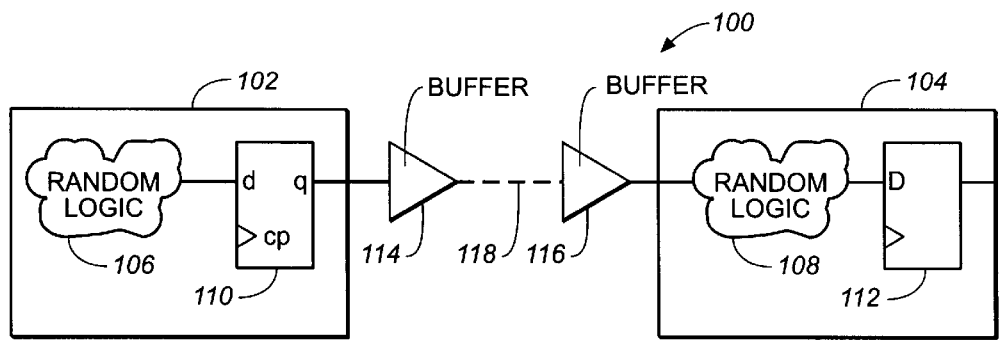
FIG._1
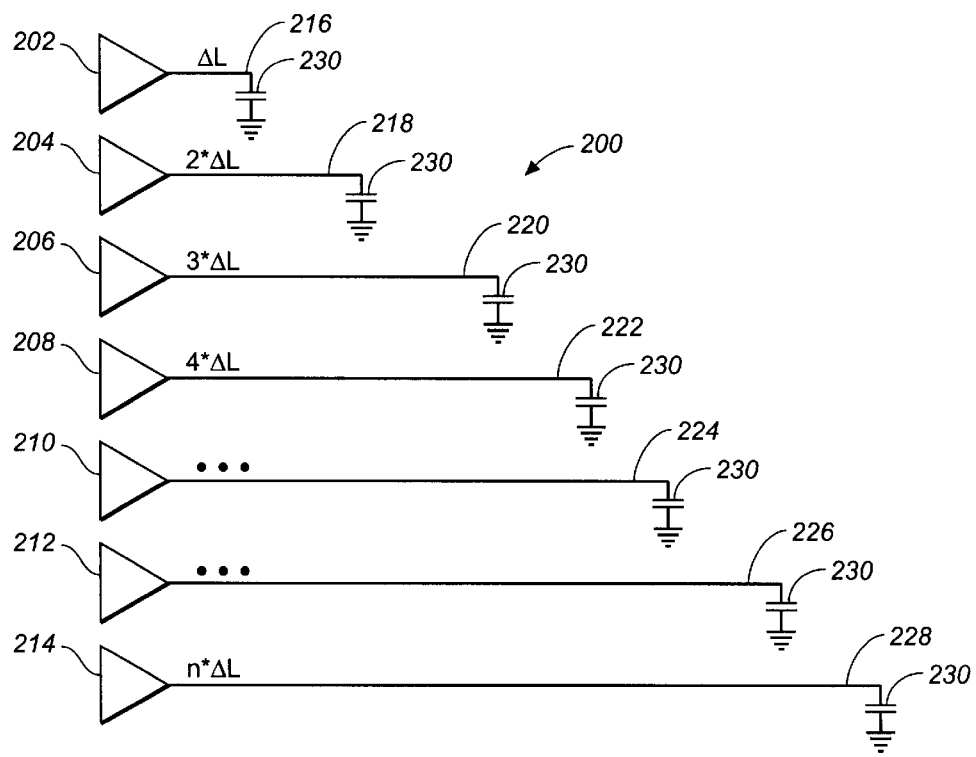
FIG._2

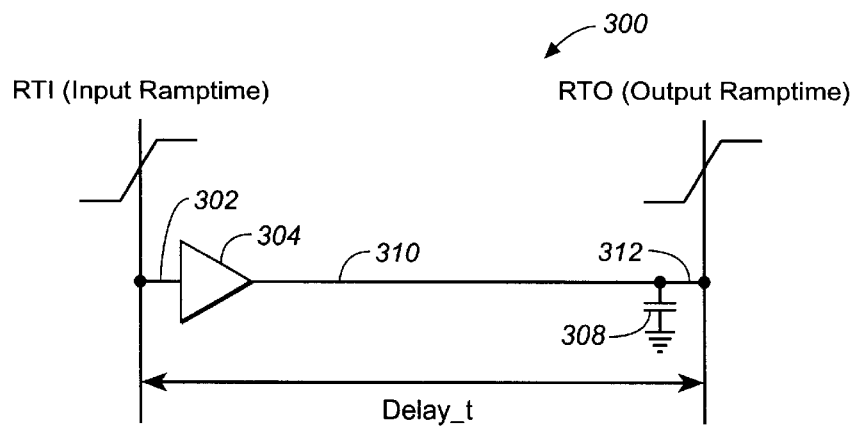
FIG._3
| | Length(i) i=0 | Length(i) i=1 | Length(i) i=2 | • • • • | Length(i) i=n |
|---|---|---|---|---|---|
| RTI (x) x=1 | Delay_t(x,i) RTO(x,i) | Delay_t(x,i) RTO(x,i) | Delay_t(x,i) RTO(x,i) | • • • • | Delay_t(x,i) RTO(x,i) |
| RTI (x) x=2 | Delay_t(x,i) RTO(x,i) | Delay_t(x,i) RTO(x,i) | Delay_t(x,i) RTO(x,i) | • • • • | Delay_t(x,i) RTO(x,i) |
| • • • • | • • • • | • • • • | • • • • | • • • • | • • • • |
| RTI (x) x=t | Delay_t(x,i) RTO(x,i) | Delay_t(x,i) RTO(x,i) | Delay_t(x,i) RTO(x,i) | • • • • | Delay_t(x,i) RTO(x,i) |
FIG._4

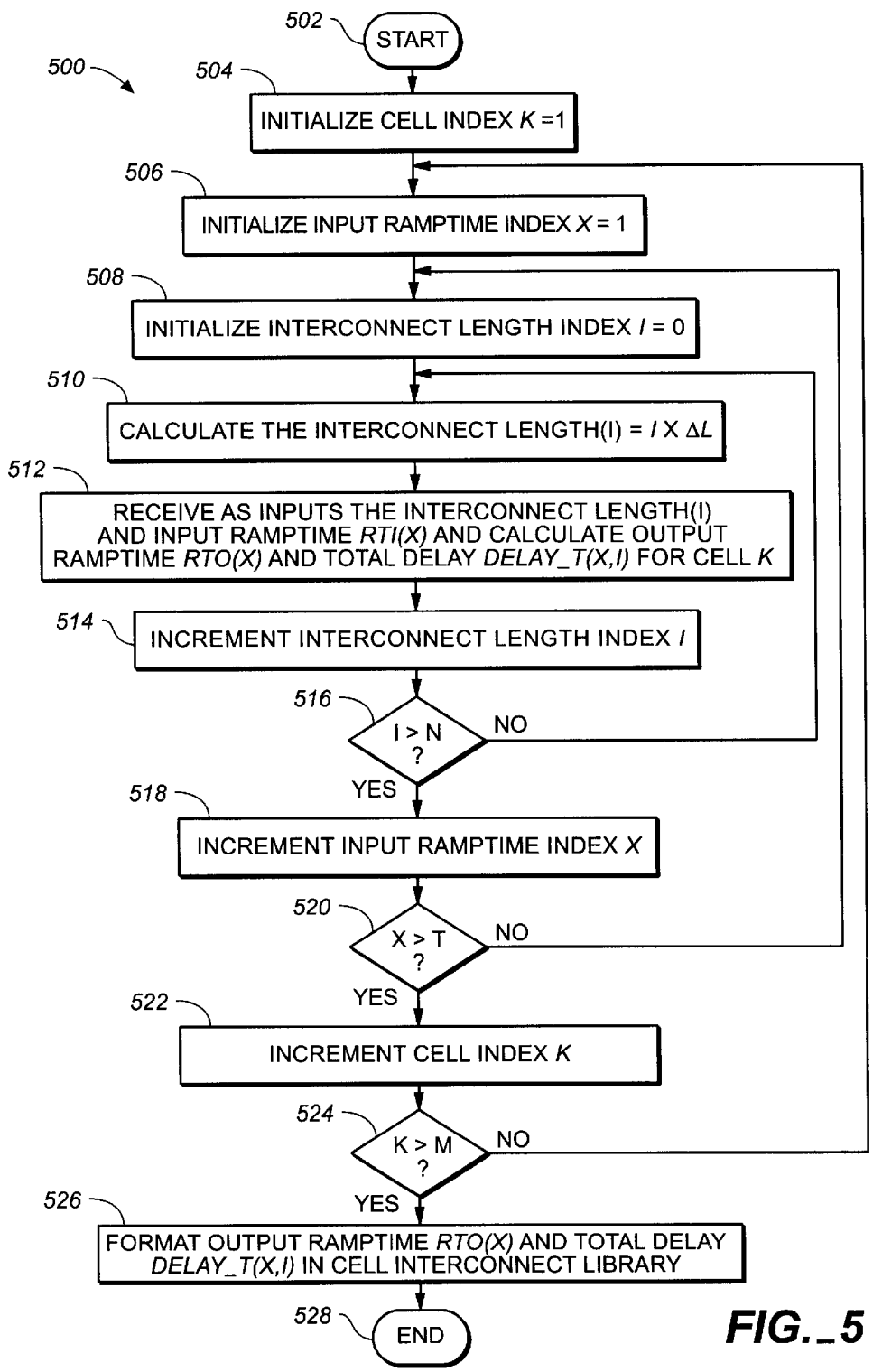
FIG._5

CELL INTERCONNECT DELAY LIBRARY FOR INTEGRATED CIRCUIT DESIGN

BACKGROUND OF THE INVENTION

The present invention relates generally to design tools for application-specific integrated circuit integrated circuit (ASIC) design. More specifically, but without limitation thereto, the present invention relates to a method for characterizing a cell delay in a library format for integrated circuit design tools.

A cell is a group of one or more circuit elements such as transistors, capacitors, and other basic circuit elements connected together to perform a function. Cells are provided as part of an ASIC design technology library that defines which cells are implemented in a specific circuit design. The task of developing specific timing models for each cell in each technology may be expedited by utilizing a technology independent, cell functional description file format to describe families of circuits for standard software models, such as Verilog models. The standard software model is used in conjunction with technology dependent cell characterization and timing data by ASIC design tools to create a set of simulation models in the widely supported Verilog hardware description language (HDL). The Verilog models may then be distributed as part of an ASIC design system.

In the past, cell interconnect timing for application-specific integrated circuit (ASIC) design tools has been characterized as only a lumped capacitance load at the output. Because interconnect length was not significant in earlier technologies, it was not accounted for during cell timing characterization. Because cell timing model libraries only include cell timing, the interconnect timing must be computed externally, for example, by a delay calculator with asymptotic waveform evaluation (AWE), resulting in excessive run times.

Besides the cost in CPU time, current methods for characterizing cell interconnect delay for deep sub-micron technologies result in significant inaccuracy, because the cell delay is determined by the cell load rather than by the cell interconnect load.

SUMMARY OF THE INVENTION

The present invention advantageously addresses the problems above as well as other problems by providing a method for characterizing cell interconnect delay that may be included in a library for use with logic design tools.

In one embodiment, the present invention may be characterized as a method of characterizing cell interconnect delay that includes the steps of (a) receiving as inputs a plurality of input ramptimes and a plurality of interconnect lengths for a selected cell, and (b) calculating an output ramptime and a total cell delay including a cell delay and an interconnect delay for each of the plurality of input ramptimes for each of the plurality of interconnect lengths for the selected cell from the inputs.

In another embodiment, the present invention may be characterized as a computer program product that includes a medium for embodying a computer program for input to a computer and a computer program embodied in the medium for causing the computer to perform at least one of the following functions: (a) receiving as inputs a plurality of input ramptimes and a plurality of interconnect lengths for a selected cell, (b) calculating an output ramptime and a total cell delay including a cell delay and an interconnect delay for each of the plurality of input ramptimes for each of the plurality of interconnect lengths for the selected cell from the inputs, and (c) generating a cell interconnect library comprising the calculated output ramptime and the total cell delay for each of the plurality of input ramptimes for each of the plurality of interconnect lengths for the selected cell.

BRIEF DESCRIPTION OF THE DRAWINGS

The above and other aspects, features and advantages of the present invention will be more apparent from the following more specific description thereof, presented in conjunction with the following drawings wherein:

FIG. 1 is a block diagram of a global net connecting two modules of the prior art;

FIG. 2 is a schematic diagram of a cell interconnect characterization according to an embodiment of the present invention;

FIG. 3 is a diagram for measuring a total delay Delay_t for the cell interconnect characterization of FIG. 2;

FIG. 4 is an illustration of an exemplary library format for the cell interconnect characterization of FIG. 2; and FIG. 5 is a flowchart for generating the cell interconnect library of FIG. 4 according to an embodiment of the present invention.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a block diagram of a global net connecting two modules of the prior art. Shown in FIG. 1 are modules 102 and 104, combinatorial logic clouds 106 and 108, latches 110 and 112, buffers 114 and 116, and a global net 118.

The modules 102 and 104 are typical of an application-specific integrated circuit (ASIC) design and each contain a group or "cloud" of logic gates interconnected to generate an output function. The outputs of the logic clouds 106 and 108 are connected respectively to the latches 110 and 112. The output of the latch 110 is buffered by the buffer 114 to propagate the output of the module 102 across the global net 118 to the buffer 116. Buffer 116 receives the output of the buffer 114 and drives the module 104. The delay between the buffer 114 and the buffer 116 is determined by the length of the global net 118. The cell interconnect delay from the buffer 114 may be characterized from a set of delays pre-calculated for multiples of a minimum length. The minimum length is a function of the wire material and size; it is the length at which signal degradation becomes significant due to wire resistance and capacitance and has a value greater than cell driver output impedance.

FIG. 2 is a schematic diagram of a cell interconnect characterization. Shown in FIG. 2 are cells 202, 204, 206, 208, 210, 212, and 214, cell interconnects 216, 218, 220, 222, 224, 226, and 228, and fanin capacitances 230. The cell 202 is connected by the cell interconnect 216 to one of the fanin capacitances 230. The cell interconnect 216 has the minimum length ΔL, for which timing degradation is negligible. The fanin capacitance 230 is the sum of the input capacitances of the cells connected by the cell interconnect 216 to the cell 202.

The cells 204, 206, 208, 210, 212, and 214 are likewise connected respectively by the cell interconnects 218, 220, 222, 224, 226, and 228 to the fanin capacitances 230. The cell interconnect 218 has an intermediate length of 2ΔL and the cell interconnect 220 has an intermediate length of 3ΔL, and so on. In this example, the length 4ΔL is the optimum length, i.e., the length resulting from inserting a buffer to achieve the shortest path delay. The length nΔL is the critical length, i.e., ¼ of the clock cycle time. The number of intermediate lengths between the minimum length, the optimum length, and the critical length is selected to provide the desired granularity or resolution of wire lengths for a cell timing library.

FIG. 3 is a diagram for measuring a total delay Delay_t including the cell delay and the cell interconnect delay for the cell interconnect characterization of FIG. 2. Shown in FIG. 3 are an input ramptime 302, a cell delay 304, a fanin capacitance 308, a cell interconnect delay 310, and an output ramptime 312. The input ramptime 302, the cell delay 304, and the cell interconnect delay 310 may be calculated, for example, from a circuit simulation using asymptotic waveform analysis (AWE) according to well known techniques. AWE may also be used to calculate the output ramptime 312 and the total delay Delay_t from the input ramptime 302, the cell delay 304, the cell interconnect delay 310, and the fanin capacitance 308 according to well known techniques. The total delay Delay_t may then be inserted in a cell interconnect library.

FIG. 4 is an illustration of an exemplary library format for the cell interconnect characterization of FIG. 2. Shown in FIG. 4 are columns 402, 404, 406, 408, 410, and 412. Column 402 contains a set of t input ramptimes RTI(x) calculated for a selected cell for x=1 to t. Columns 404, 406, 408, 410, and 412 contain respectively the output ramptime RTO(x,i) and the total delay Delay_t(x,i) for each wire length iΔL, where i=0 to n. Each row contains the input ramptime RTI(x) and the corresponding output ramptimes RTO(x,i) and total delays Delay_t(x,i). A cell interconnect library containing the cell timing information shown in FIG. 4 may be generated by a computer program for use with logic design layout tools for cell placement and in-place optimization from the flowchart of FIGS. 5A and 5B.

FIG. 5 is a flowchart 500 for generating the cell interconnect library of FIG. 4.

Step 502 is the entry point for flowchart 500.

In step 504, a cell index k is initialized to one. The cell index k identifies each selected cell type in the cell interconnect library.

In step 506, an input ramptime index x is initialized to one. The input ramptime index x identifies each of the input ramptimes RTI(x) calculated for each selected cell.

In step 508, an interconnect length index i is initialized to zero. The interconnect length index i identifies each of the cell interconnects for the minimum length, the intermediate lengths, the optimum length, and the critical length.

In step 510, the interconnect length (i)=iΔL is calculated for each interconnect length index i.

In step 512, the input ramptime RTI(x) and the interconnect length(i) for the cell k are received as inputs to calculate the output ramptime RTO(x,i) and the total delay Delay_t (x,i).

In step 514, the interconnect length index i is incremented by one.

In step 516, a check is performed to determine whether the interconnect length index i exceeds an interconnect length index endpoint n. If the interconnect length index i does not exceed the interconnect length index endpoint n, then the flowchart transfers control from step 516 back to step 510.

In step 518, the input ramptime index x is incremented by one.

In step 520, a check is performed to determine whether the input ramptime index x exceeds an input ramptime index endpoint t. If the input ramptime index x does not exceed the input ramptime index endpoint t, then the flowchart transfers control from step 520 back to step 508.

In step 522, the cell index k is incremented by one.

In step 524, a check is performed to determine whether the cell index k exceeds a maximum cell index m. If the cell index k does not exceed the maximum cell index m, then the flowchart transfers control from step 524 back to step 506.

In step 526, the calculated output ramptimes RTO(x,i) and the total delays Delay_t(x,i) for each input ramptime RTI(x) and interconnect length(i) for each cell k are formatted in a cell interconnect library.

Step 528 is the exit point for the flowchart 500.

The flowchart 500 may be implemented in a computer program and stored on a computer readable medium according to well known techniques for generating the cell interconnect library of FIG. 4. The cell interconnect library may be used during circuit design to look up the total cell delay Delay_t from an input ramptime and an interconnect length for each cell in a circuit design.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of generating a cell interconnect delay library comprising the steps of:

(a) receiving as inputs a plurality of input ramptimes and a plurality of interconnect lengths for a selected cell;

(b) calculating an output ramptime and a total cell delay including a cell delay and an interconnect delay for each of the plurality of input ramptimes for each of the plurality of interconnect lengths for the selected cell from the inputs; and (c) initializing an index, said index selected from the group of indexes comprising an input ramptime index and interconnect length index.

2. The method of claim 1 wherein the plurality of interconnect lengths includes a minimum length.

3. The method of claim 1 wherein the plurality of interconnect lengths includes an optimum length that is a multiple of the minimum length.

4. The method of claim 1 wherein the plurality of interconnect lengths includes a critical length that is a multiple of the minimum length.

5. The method of claim 1 wherein the plurality of interconnect lengths includes at least one intermediate length that is a multiple of the minimum length.

6. The method of claim 1 wherein step (a) further comprises receiving as an input a fanin capacitance.

7. The method of claim 1 further comprising the step of (c) generating as output the calculated output ramptime and the cell timing delay for each of the plurality of input ramptimes for each of the plurality of interconnect lengths for the selected cell in a cell interconnect delay library.

8. A computer program product comprising:

a medium for embodying a computer program for input to a computer; and a computer program embodied in the medium for causing the computer to perform at least one of the following functions:
- (a) receiving as inputs a plurality of input ramptimes and a plurality of interconnect lengths for a selected cell;
- (b) calculating an output ramptime and a total cell delay including a cell delay and an interconnect delay for each of the plurality of input ramptimes for each of the plurality of interconnect lengths for the selected cell from the inputs;
- (c) generating as output the calculated output ramptime and the total cell delay for each of-the plurality of input ramptimes for each of the plurality of interconnect lengths for the selected cell in a cell interconnect delay library; and
- (d) initializing an index, said index selected from the group of indexes comprising an input ramptime index and interconnect length index.

9. The computer program product of claim 8 wherein the plurality of interconnect lengths includes a minimum length.

10. The computer program product of claim 8 wherein the plurality of interconnect lengths includes an optimum length that is a multiple of the minimum length.

11. The computer program product of claim 8 wherein the plurality of interconnect lengths includes a critical length that is a multiple of the minimum length.

12. The computer program product of claim 8 wherein the plurality of interconnect lengths includes at least one intermediate length that is a multiple of the minimum length.

13. The computer program product of claim 8 wherein step (a) further comprises receiving as an input a fanin capacitance for the selected cell.

14. A method of generating a cell interconnect delay library comprising the steps of:
- (a) receiving as inputs a plurality of input ramptimes and a plurality of interconnect lengths for a selected cell wherein the selected cell is a buffer;
- (b) calculating an output ramptime and a total cell delay including a cell delay and an interconnect delay for each of the plurality of input ramptimes for each of the plurality of interconnect lengths for the selected cell from the inputs; and
- (c) initializing an index, said index selected from the group of indexes comprising an input ramptime index and interconnect length index.

15. A method of generating a cell interconnect delay library comprising the steps of:
- (a) initializing a cell index to one for a plurality of selected cells;
- (b) initializing an input ramptime index to one;
- (c) initializing an interconnect length index to zero;
- (d) calculating an interconnect length corresponding to the interconnect length index;
- (e) receiving an input ramptime corresponding to the input ramptime index for the one of the plurality of selected cells corresponding to the cell index;
- (f) calculating an output ramptime and a total delay corresponding to the ramptime index and the interconnect length index from the input ramptime and the interconnect length;
- (g) incrementing the interconnect length index by one;
- (h) if the interconnect length index exceeds an interconnect length index endpoint, then transferring control to step (i), else transferring control to step (d);
- (i) incrementing the input ramptime index by one;
- (j) if the input ramptime index exceeds an input ramptime index endpoint, then transferring control to step (k), else transferring control to step (c);
- (k) incrementing the cell index by one;
- (l) if the cell index exceeds a maximum cell index, then transferring control to step (m), else transferring control to step (b); and
- (m) generating as output the calculated output ramptimes and the total delays for each input ramptime and interconnect length for each of the plurality of selected cells in a cell interconnect library.

16. A computer program product for generating a cell interconnect delay library comprising:
- a medium for embodying a computer program for input to a computer; and
- a computer program embodied in the medium for causing the computer to perform at least one of the following functions:
  - (a) initializing a cell index to one for a plurality of selected cells;
  - (b) initializing an input ramptime index to one;
  - (c) initializing an interconnect length index to zero;
  - (d) calculating an interconnect length corresponding to the interconnect length index;
  - (e) receiving an input ramptime corresponding to the input ramptime index for the one of the plurality of selected cells corresponding to the cell index;
  - (f) calculating an output ramptime and a total delay corresponding to the ramptime index and the interconnect length index from the input ramptime and the interconnect length;
  - (g) incrementing the interconnect length index by one;
  - (h) if the interconnect length index exceeds an interconnect length index endpoint, then transferring control to step (i), else transferring control to step (d);
  - (i) incrementing the input ramptime index by one;
  - (j) if the input ramptime index exceeds an input ramptime index endpoint, then transferring control to step (k), else transferring control to step (c);
  - (k) incrementing the cell index by one;
  - (l) if the cell index exceeds a maximum c ell index, then transferring control to step (m), else transferring control to step (b); and
  - (m) generating as output the calculated output ramptimes and the total delays for each input ramptime and interconnect length for each of the plurality of selected cells in a cell interconnect library.

\* \* \* \* \*